(12) United States Patent
Biggs

(10) Patent No.: US 6,206,275 B1
(45) Date of Patent: Mar. 27, 2001

(54) DEEP ACCESS, CLOSE PROXIMITY, FINE PITCH BONDING OF LARGE WIRE

(75) Inventor: Kenneth L. Biggs, Orange, CA (US)

(73) Assignee: F & K Delvotec Bondtechnik GmbH (DE)

( * ) Notice: Subject to any disclaimer, the term of this patent is extended or adjusted under 35 U.S.C. 154(b) by 0 days.

(21) Appl. No.: 09/516,808

(22) Filed: Mar. 1, 2000

Related U.S. Application Data

(60) Provisional application No. 60/159,158, filed on Oct. 13, 1999.

(51) Int. Cl.[7] ............................. B23K 35/02; B23K 37/02
(52) U.S. Cl. ......................... 228/180.5; 228/4.5; 228/5.1
(58) Field of Search ............................. 228/180.5, 110.1, 228/112.1, 1.1, 28, 4.5, 5.1; 156/73.2

(56) References Cited

U.S. PATENT DOCUMENTS

| | | | |
|---|---|---|---|
| 3,627,192 | * | 12/1971 | Killingsworth . |
| 3,711,341 | * | 1/1973 | Joshi et al. . |
| 3,747,198 | * | 7/1973 | Benson et al. . |
| 4,619,397 | | 10/1986 | Urban . |
| 4,781,319 | | 11/1988 | Deubzer et al. . |
| 5,277,354 | | 1/1994 | Farassat . |
| 5,314,105 | | 5/1994 | Farassat . |
| 5,452,838 | | 9/1995 | Farassat . |
| 5,452,841 | * | 9/1995 | Sibata et al. . |
| 5,495,976 | * | 3/1996 | Mironesco et al. . |
| 5,558,270 | * | 9/1996 | Nachon et al. . |
| 5,906,706 | | 5/1999 | Farassat . |
| 5,950,903 | | 9/1999 | Farassat . |

* cited by examiner

Primary Examiner—Patrick Ryan
Assistant Examiner—Jonathan Johnson
(74) Attorney, Agent, or Firm—Knobbe, Martens, Olson & Bear, LLP

(57) ABSTRACT

This invention relates to a wire bonding apparatus for bonding wire to a substrate wherein the components used to guide, bond and cut the wire have a reduced cross-sectional dimension near the substrate to enable close proximity, deep access, fine pitch bonding. This is accomplished in part by forming a wire guide integrally through a substantial portion of the bonding tool, thereby completely eliminating one component found in conventional wire bonding apparatus. This is further accomplished by tapering the size of the bonding tool toward the substrate such that the bonding tool in a lower portion has a smaller cross-sectional area. A cutter extends adjacent the lower portion of the bonding tool and into the area that would otherwise be occupied by the lower portion of the bonding tool if not for the taper. Thus, both the cutter and the lower portion of the bonding tool occupy a minimal amount of space adjacent the substrate.

22 Claims, 9 Drawing Sheets

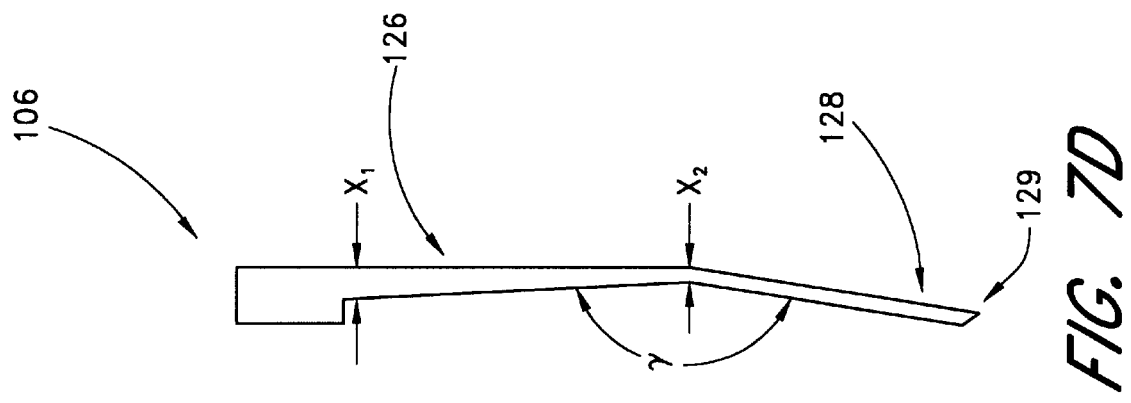
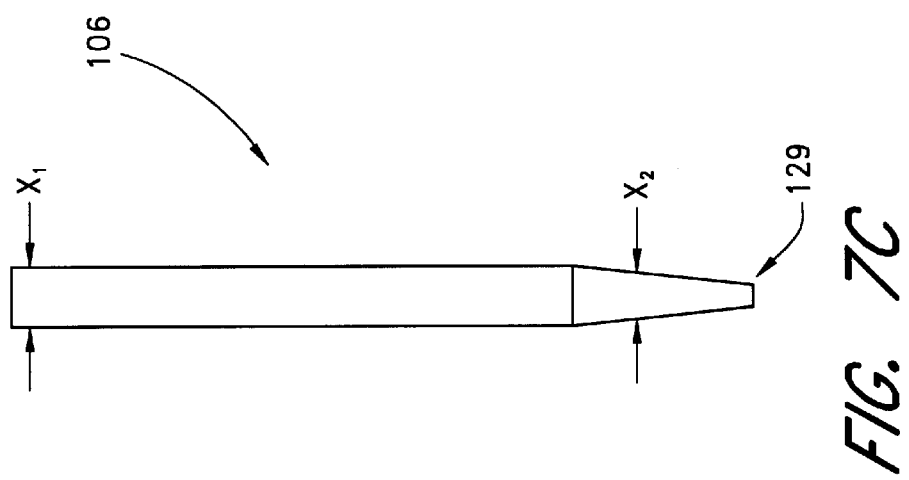

DEEP ACCESS, CLOSE PROXIMITY, FINE PITCH BONDING OF LARGE WIRE

CROSS-REFERENCE TO RELATED APPLICATION

This application claims the benefit of U.S. Provisional Application Serial No. 60/159,158, filed Oct. 13, 1999.

BACKGROUND OF THE INVENTION

1. Field of the Invention

This invention relates to the bonding of wires to a substrate, and more particularly, to a method and apparatus enabling deep access, close proximity, fine pitch ultrasonic bonding of large wire.

2. Description of the Related Art

Wire bonding is the process of making electrical connections in semiconductor components by means of electrically conductive wire, typically wire with a diameter of from 12 microns to 500 microns. Examples of electrical connections which can be made using wire bonding techniques include connections between the contact surfaces of discrete or integrated chips and the contact leads of their packages, and, in the case of hybrid circuits, the connections between inserted monolithic elements and the film circuit which contains them.

A number of wire bonding techniques have been developed, and one which has been particularly successful is a microwelding technique using ultrasound. An automatic wire bonding apparatus on which such a technique can be operated is described in U.S. Pat. No. 4,619,397. Aluminum wire, for instance, in contact with the contact surface to which it is to be bonded, is moved vigorously along the surface to which it is to be bonded so that its oxide layer breaks open. The wire is then subjected to pressure, and a permanent junction is created between the two materials. Motion of the wire is generated by an ultrasonic transducer excited by an ultrasonic generator to produce high-frequency mechanical vibrations.

In the particular wire bonding process known as wedge bonding, the ultrasonic energy is supplied at a level correlated to the wire size used. The ultrasonic energy is directed to the aluminum or other type of wire by a special tool known as a "wedge." The wire is fed through a guide at the bottom of the wedge. When the wedge with the wire touches the surface to which the wire is to be bonded, movement is stopped. The wire is pressed down with a small defined force, known as the bonding weight, and the wire is slightly deformed. This small deformation is known as the "pre-deformation." Ultrasonic energy is now switched on, and the welding process starts. During this time, the diameter of the wire is reduced by a few microns, the actual reduction depending on the size, physical properties and the precise chemical nature of the wire.

Large wire bonding is defined as attaching about 0.005–0.020 inch (about 125 microns to 500 microns) electrical conductive wire to power devices as used in the semiconductor industry. Wires may be aluminum (Al), gold (Au) and copper (Cu), for instance, with aluminum wires being most prevalent. However, wires other than Al, Au and Cu may be used. Ultrasonic energy and elevated temperature of a work piece (in some cases) is the principle method of attaching these large wires to the power devices and/or semiconductors using a bonding tool or wedge.

Wire bonders, and especially large wire bonders, often require a cutter to terminate the wire. This cutter is typically positioned adjacent the bond wedge and brought down with a Z-axis motion to cut wire after a bond has been made. One example of a cutter positioned adjacent a bonding wedge is shown in U.S. Pat. No. 5,906,706.

Present wire bonders bring wire to the bonding tool, for example, by an independent wire guide of two types. In the first type, a separate member consisting of a wire guide capillary is held in place behind the wedge and at a specific angle to the bonding wedge. This wire guide capillary is disclosed, for instance, in U.S. Pat. No. 5,452,838. In the second type, a "clip on" wire guide member that separately attaches to the bonding wedge. The "clip on" wire guide member is disclosed, for instance, in U.S. Pat. No. 5,906,706.

In both wire guiding methods, the wire is held in position so as to locate the wire directly below the tip of the bond wedge. After the wire is brought to the work piece or substrate, loop forms are made with a combination of machine tool motion and friction within the two types of wire guides described above.

Unfortunately, the prior art tools require too much room to work with many emerging chips. As integrated circuits are made smaller, the resulting chips have less access space within which to bond wires. The combination of the bonding wedge or tool and separate wire guide described above precludes these wire bonders from being able to access newer power devices that call for deep-access, close proximity, and/or fine pitch wire bonding. Fine pitch wire bonding refers to wires bonded side-by-side as close as possible. Furthermore, when a wire cutter is used, the cutter adds additional dimension near the tip of the bonding tool making it even more difficult to access deep, tight spaces on a substrate.

SUMMARY OF THE INVENTION

Accordingly, what is needed is a wire bonder capable of performing deep access, close proximity, fine pitch wire bonding on a substrate. These and other needs are accomplished by satisfying one or more of the following objects of the present invention:

1. To eliminate the capillary and clip-on wire guides of present wire bonders;
2. To replace the known type of bond wedge with a type that incorporates a wire guide;
3. To replace the known type of wire cutter with a type that intersects with the shank diameter of the conventional wedge;
4. To reduce the size of a wire bonder with a cutter/wire guide/bond tool to less than one-half of the size of these components in techniques currently employed;
5. To reduce the need for extra machine control motions for certain loop forms and gain faster machine cycle rate;
6. To meet the challenges of deep access/close proximity/fine pitch wire bonding on new type power devices.

Briefly stated, the preferred embodiments of the present invention describe a wire bonding apparatus for bonding wire to a substrate wherein the components used to guide, bond and cut the wire have a reduced cross-sectional dimension near the substrate to enable close proximity, deep access, fine pitch bonding. This is accomplished in part by forming a wire guide integrally through a substantial portion of the bonding tool, thereby completely eliminating one component found in conventional wire bonding apparatus. This is further accomplished by tapering the size of the bonding tool toward the substrate such that the bonding tool in a lower or distal portion has a smaller cross-sectional area. A cutter extends adjacent the lower portion of the bonding tool and into the area that would otherwise be occupied by the lower portion of the bonding tool if not for the taper. Thus, both the cutter and the lower portion of the bonding tool occupy a minimal amount of space adjacent the substrate.

In one aspect of the present invention, a wire bonding apparatus for bonding wire to a substrate is provided. The apparatus comprises an ultrasonic bonding tool having an upper portion, a lower portion and a bottom tip. The bonding tool in the lower portion adjacent the tip has a reduced cross-sectional area compared to the cross-sectional area of the bonding tool in the upper portion. A cutter mounted adjacent the bonding tool extends along at least a portion of the bonding tool toward the tip. More particularly, the cutter extends at least partially into a projection of the cross-sectional area of the upper portion onto a plane perpendicular to the longitudinal axis of the bonding tool.

In another aspect of the present invention, the wire bonding apparatus comprises a bonding tool extending longitudinally between a proximal portion and a distal portion. The distal portion of the bonding tool includes a bonding tip for ultrasonically bonding wire to a substrate. A cutter mounted adjacent the bonding tool extending substantially longitudinally adjacent at least a portion of the bonding tool. The cutter has a proximal portion and a distal portion, the distal portion of the cutter including a cutting tip. At least the distal portion of the cutter extends adjacent the distal portion of the bonding tool. An undercut area is provided between the proximal portion of the bonding tool and the tip of the bonding tool which is configured to accommodate at least a portion of the cutter. At least part of the distal portion of the cutter extends into the undercut area. The combination of the distal portion of the cutter and the distal tip of the bonding tool occupies a cross sectional area that is substantially no greater than the cross sectional area of the proximal portion of the bonding tool.

In another aspect of the present invention, a bonding tool is provided comprising an elongate body having a first end to be positioned adjacent a substrate and a second end. Means for reducing the cross-sectional area of the elongate body adjacent the first end accommodates placement of a cutter.

In another aspect of the present invention, a method of bonding wire to a substrate is provided. A bonding tool is provided having an upper portion and a lower portion defining a longitudinal axis therebetween. The lower portion has a smaller cross-sectional area than the upper portion, and includes a bonding tip. Wire is guided to a position between the lower portion of the bonding tool and the substrate, where it is ultrasonically bonded to the substrate using the bonding tool. A cutter is provided having a cutting tip adjacent the substrate, the cutter extending generally longitudinally along the length of the bonding tool. The cutting tip is positioned within a projection of the cross-sectional area of the upper portion of the bonding tool onto a plane perpendicular to the longitudinal axis of the bonding tool. The wire is cut after bonding the wire with the cutting tip.

In another aspect of the present invention, a method is provided for reducing the space required to ultrasonically bond wire to a substrate. A bonding tool is provided having a bonding tip to be positioned adjacent the substrate. A portion of the bonding tool is undercut near the bonding tip to reduce the cross-sectional area of the bonding tool near the substrate. A cutter is mounted adjacent the bonding tool, the cutter having a cutting tip that extends into the undercut area of the bonding tool.

BRIEF DESCRIPTION OF THE DRAWINGS

FIGS. 7C–7D are schematic side views of a cutter according to one embodiment of the present invention.

DETAILED DESCRIPTION OF THE PREFERRED EMBODIMENTS

The preferred embodiments of the present invention involve the use of a large wire bonder for bonding wire to a substrate. However, it will be appreciated that these embodiments are applicable to any type of bonding apparatus, especially those in which deeper access, close proximity and/or fine pitch bonding is desired.

Figure 1:
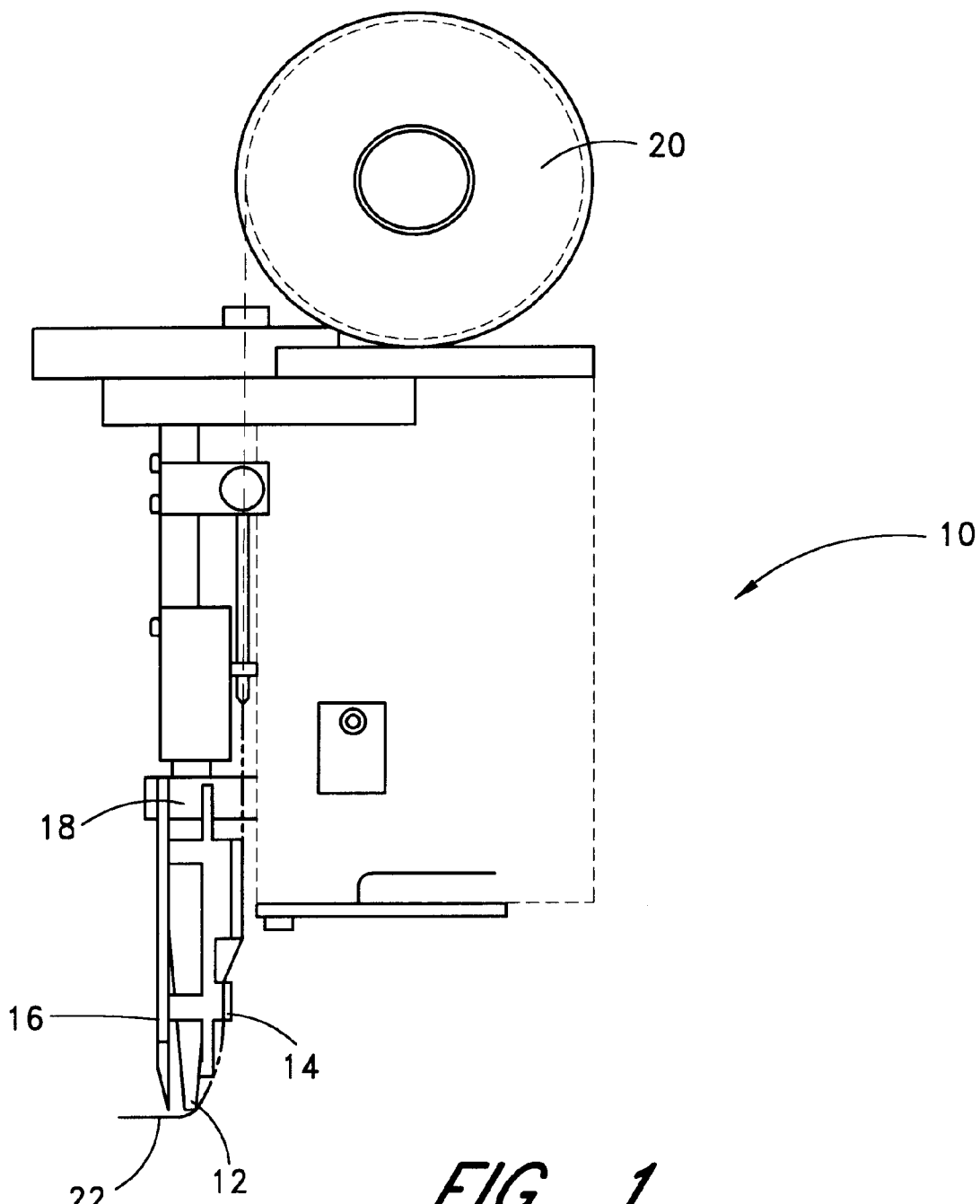
FIG. 1 is a schematic side view of a wire bonder including a wire guide clipped to the bonding tool and a wire cutter.

FIG. 1 illustrates schematically the bonding head 10 of a prior art large wire bonder that is used to bond wire to a substrate (not shown). The bonding head 10 includes a bonding tool or wedge 12, a wire guide 14 clipped onto the wedge 12 and a wire cutter 16. A transducer 18 is connected to the wedge 12 to ultrasonically bond wire 22 from wire spool 20 to a substrate beneath the bottom tip of the bonding tool 12.

The bond head 10 moves up and down with a Z axis motion to bring the bonding tool 12, wire guide 14 and wire cutter 16 down to and away from a substrate. The bonding tool 12 and wire guide 14 are also capable of separate Z axis movement independent of the wire cutter 16 through the use of a magnetic actuator to provide fine adjustment, such as a voice coil (not shown), which also provides bias to the bonding tool 12.

Wire bonds are typically made to form wire loops on the substrate. After a first bond is made on a substrate, the bonding tool is raised upward and rearward to a second location on the substrate. Excess wire is fed through the wire guide between the first and second bonding location, such that a loop is formed between the two locations. Because the separate wire guide 14 directs wire down to the bonding location at an acute angle to the substrate, often an extra machine step or combined "y" and "z" motion is required to move the bonding apparatus forward (i.e., opposite of the direction of bonding from the first to second bonding location) to form a bend in the wire prior to forming the second bond so as to perform the wire for loop formation.

To cut a wire 22 after it has been bonded to a substrate, the bonding tool 12 is first raised and moved rearward, away from the bonding location. Through the use of the voice coil, the bonding tool 12 and the wire guide 14 are raised in the Z axis relative to the cutter 16. The cutter then descends in the Z axis to form a nick in the wire. Movement of the cutter 16, and more particularly, the termination of the cutter movement while forming the nick in the wire, is computer controlled. The bond head is then raised away from the substrate to break the wire 22 at the nick.

The above-described components of the bond head 10, namely the bonding tool 12, the wire guide 14 and the wire cutter 16 occupy a large amount of space near the bottom tip of the bonding tool. This makes it difficult for the bonding tool to bond wires in deep access locations. Moreover, the size of these components makes it difficult to bond wires in close proximity or perform fine pitch bonding.

Figure 2:
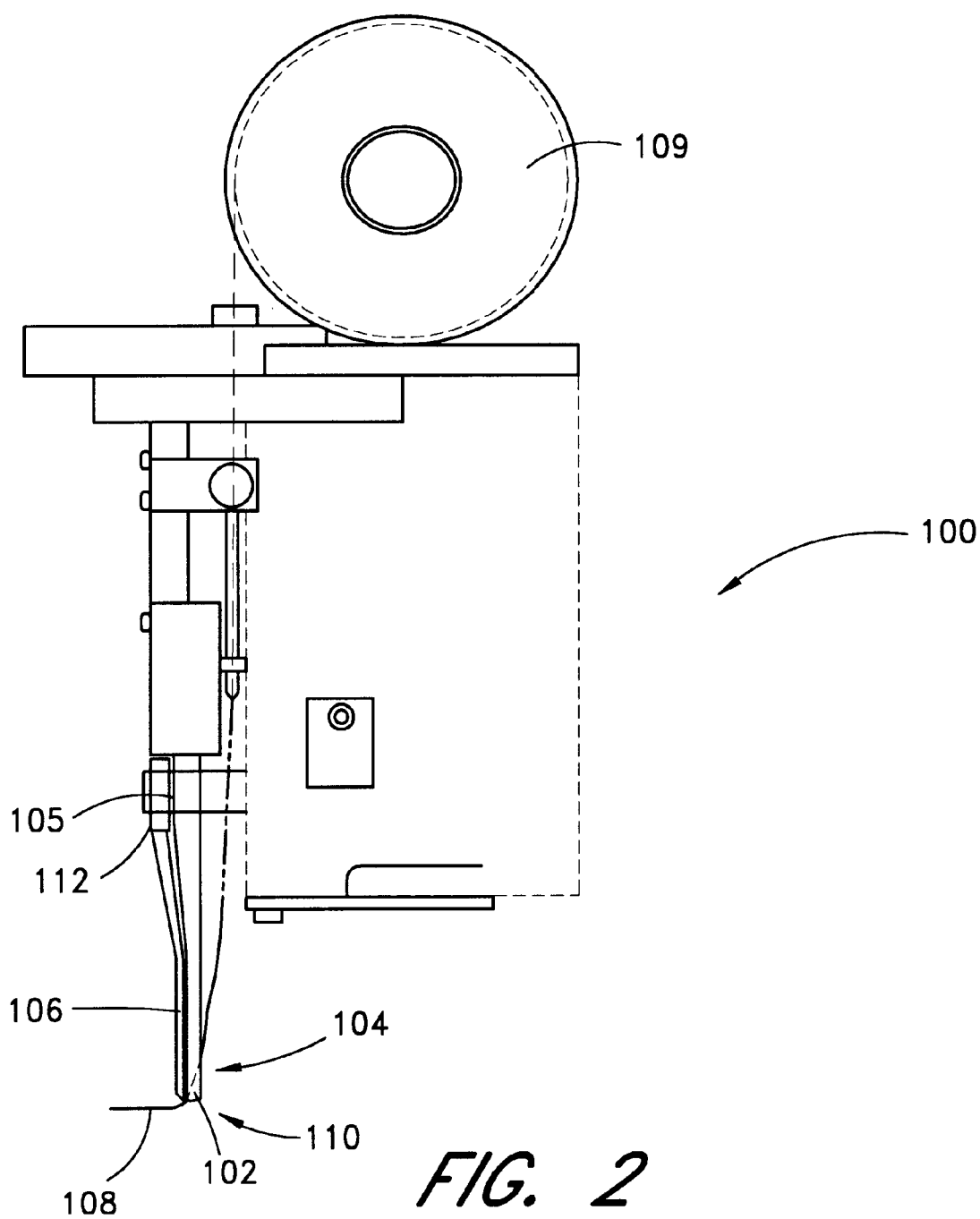
FIG. 2 is a schematic side view of a wire bonder including an integral wire guide and an angled wire cutter.

Thus, in one embodiment of the present invention, a bond head is provided similar to that of FIG. 1, but enabling the bonding tool to access tighter spaces and provide close proximity, fine pitch bonding. As shown in FIG. 2, this bond head 100 preferably includes a bonding tool 102 having an integrally formed wire guide 104, and a cutter 106, both of which are described in further detail below. A wire 108 extends down from a wire spool 109 through the wire guide 104 in the bonding tool toward the bottom or distal tip 110 of the bonding tool. Transducer 105 is connected to the bonding tool 102 to ultrasonically bond wire 108 to a substrate at bonding tip 110.

As described below, the bonding tool 102 is preferably tapered and reduces in cross-sectional area toward the tip 110, such that the bonding tool has an undercut area configured to accommodate a distal or lower portion of the wire cutter 106. In one preferred embodiment this undercut area is provided by inclining a surface of the bonding tool on the cutter side of the tool toward the bottom tip 110. It will be appreciated, however, that the undercut area of the bonding tool may be formed to have other shapes and configurations capable of accommodating at least a portion of the cutter.

As shown in FIG. 2, at the bottom tip 110 the bonding tool 102 is small enough to enable the tool to access small spaces on a substrate. The cutter 106 is mounted adjacent the bonding tool 102 and preferably extends from a cutter holder 112 toward the bottom tip 110, and more preferably, extends directly adjacent the reduced cross-sectional portion of the bonding tool 102 into the undercut area to minimize the size of the cutter and bonding tool in combination at the bottom tip 110. Preferably, the apparatus adjacent the substrate, namely the cutter, bonding tool and wire guide occupy about one-half or less of the space occupied by the equivalent component of FIG. 1 above. Further details of the bonding tool, cutter and wire guide are described in conjunction with FIGS. 3A–8 below.

Figure 3:
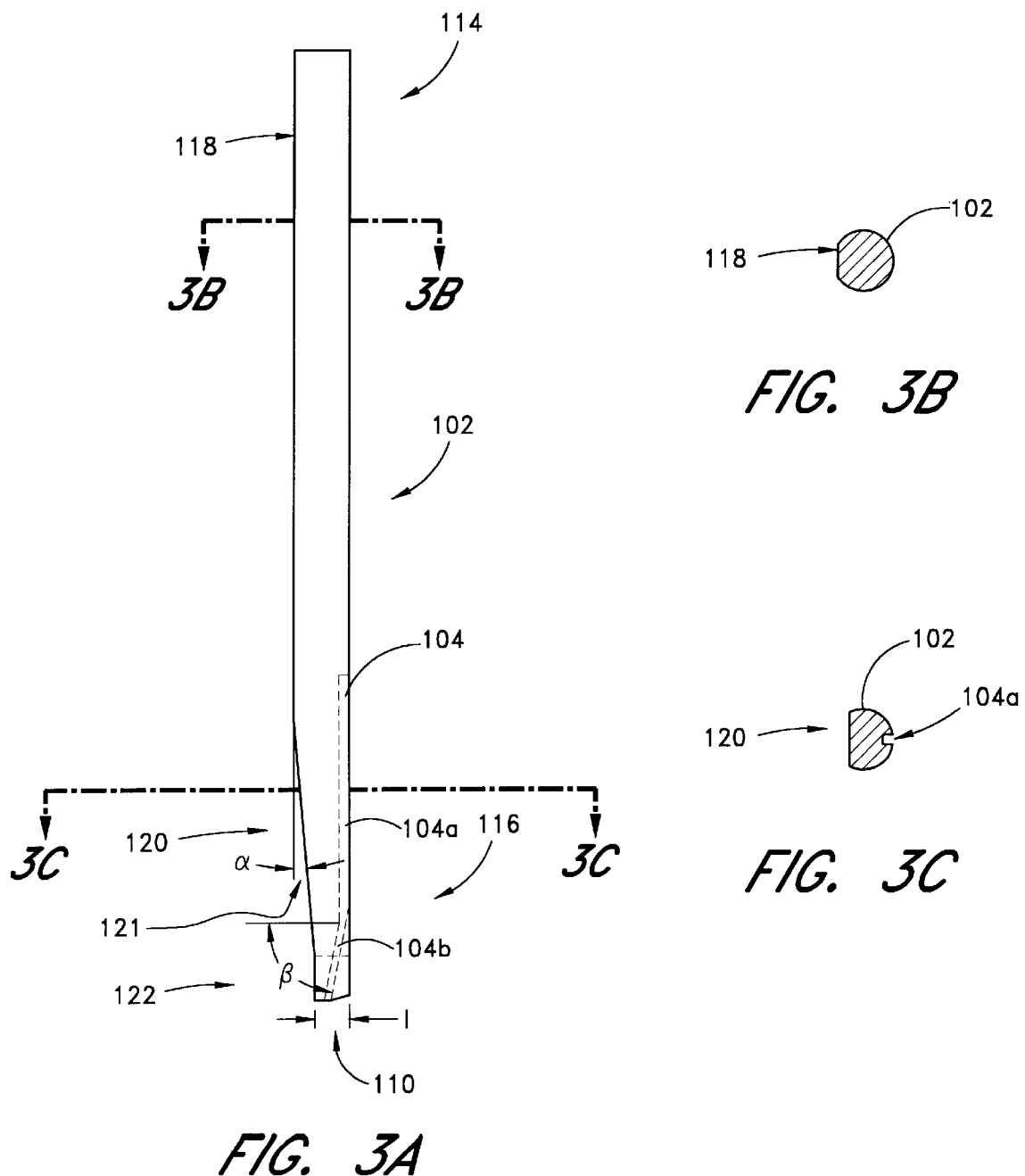
FIG. 3A is a schematic side view of a bonding tool according to one embodiment of the present invention.
FIG. 3B is a sectional view along line 3B—3B of FIG. 3A.
FIG. 3C is a sectional view along line 3C—3C of FIG. 3A
Figure 4:
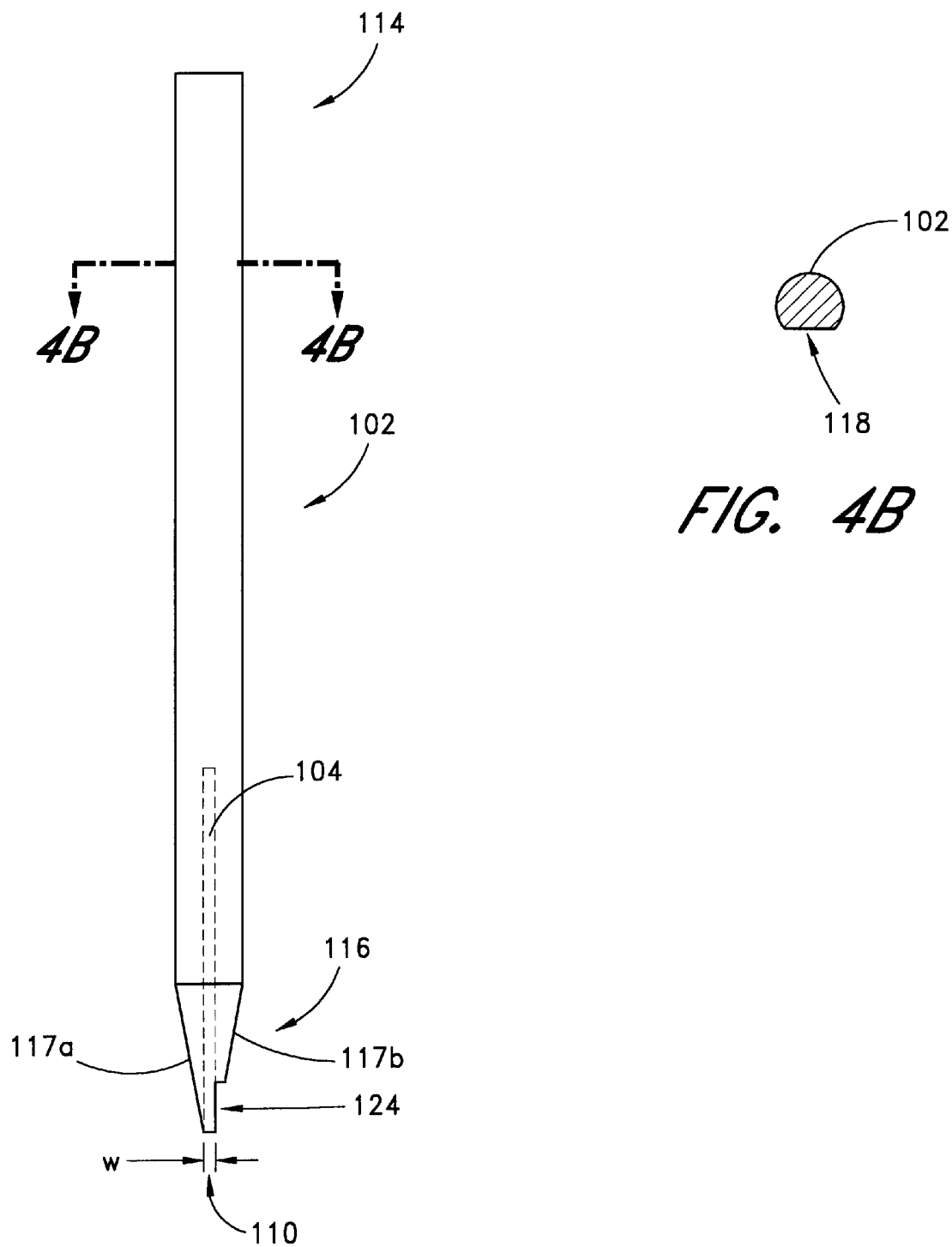
FIG. 4A is a schematic side view of the bonding tool of FIG. 3A, rotated 90 degrees along its longitudinal axis.
FIG. 4B is a sectional view along lines 4B—4B of FIG. 4A.

FIGS. 3A–4B show more particularly one embodiment of a bonding tool according to the present invention. As shown in FIGS. 3A–3C, the bonding tool 102 is an elongate body having an upper or proximal portion 114 and a lower or distal portion 116, with a bottom on distal tip 110 in the lower portion to bond wire to a substrate. As used herein, "lower" is in a direction toward the tip 110 to be positioned adjacent a substrate, and "upper" is in a direction away from the tip. Thus, although the figures depict the bonding tool as having a substantially vertical orientation with upper and lower portions, it will be appreciated that the bonding tool may also have nonvertical orientations as well. It will also be appreciated that although the preferred embodiments describe the longitudinal axis of the bonding tool as being generally perpendicular to the substrate, other orientations are contemplated as well.

The bonding tool 102 preferably has a generally circular cross-section in upper portion 114, and tapers to a reduced cross-sectional size in lower portion 116 as described below. It will be appreciated that cross-sections other than circular may also be used for the bonding tool. The bonding tool 102 preferably has a length extending from the top of the upper portion 114 to the bottom tip 110 of about 2 to 3 inches, and in the embodiment shown in FIG. 3A, of about 2 inches. The diameter of the generally circular cross-section of the upper portion is preferably between about 0.1 and 0.2 inches, and in the embodiment shown in FIGS. 3A and 3B, is about 0.125 inches.

More preferably, upper portion 114 has a substantially constant cross-sectional area therethrough and includes a generally flat, substantially vertical surface 118, shown in FIG. 3B, on the side adjacent the cutter 106 (shown in FIG. 2) that extends parallel to the longitudinal axis of the bonding tool. The flat surface 118 enables the tool to be fixed to the transducer 105 (not shown) with a set screw. This flat surface 118 preferably extends along the entire length of the upper portion 114.

In the embodiment shown in FIG. 3A, where the diameter of the upper portion 114 is generally about 0.125 inches, the flat surface 118 of the bonding tool is provided at about 0.110 inches from an opposite point along the circumference of the upper portion 114. This point on the circumference is preferably the farthest point on the circumference of the upper portion 114 from the cutter (shown in FIG. 2), and the surface 118 is provided parallel to the tangent corresponding to this point.

The bonding tool 102 preferably tapers to a smaller cross-sectional area in lower portion 116. This taper is preferably accomplished by forming an undercut area 121 underneath the upper portion 114, and more preferably by forming an inclined surface on the cutter side of the tool. As shown in FIGS. 3A and 3C, this inclined surface 120 extends from surface 118 in upper portion 114 downward toward bottom tip 110 and toward the opposite side of the bonding tool. This inclined surface 120 is preferably a flat surface forming an angle of incline $\alpha$ relative to the substantially vertical surface 118. In one embodiment, the angle of incline $\alpha$ of surface 120 relative to vertical surface 118 is preferably between about 5 and 20 degrees, more preferably between about 5 and 7 degrees. The length of the inclined surface 120 extending from the intersection with the vertical surface 118, and the intersection with the vertical surface 122 described below, can vary depending on the angle of incline $\alpha$ and the desired size of the undercut area. In one embodiment, for example, where the length of the bonding tool is about 2 inches, the length of the inclined surface 120 is about 0.6 inches.

Figure 8:
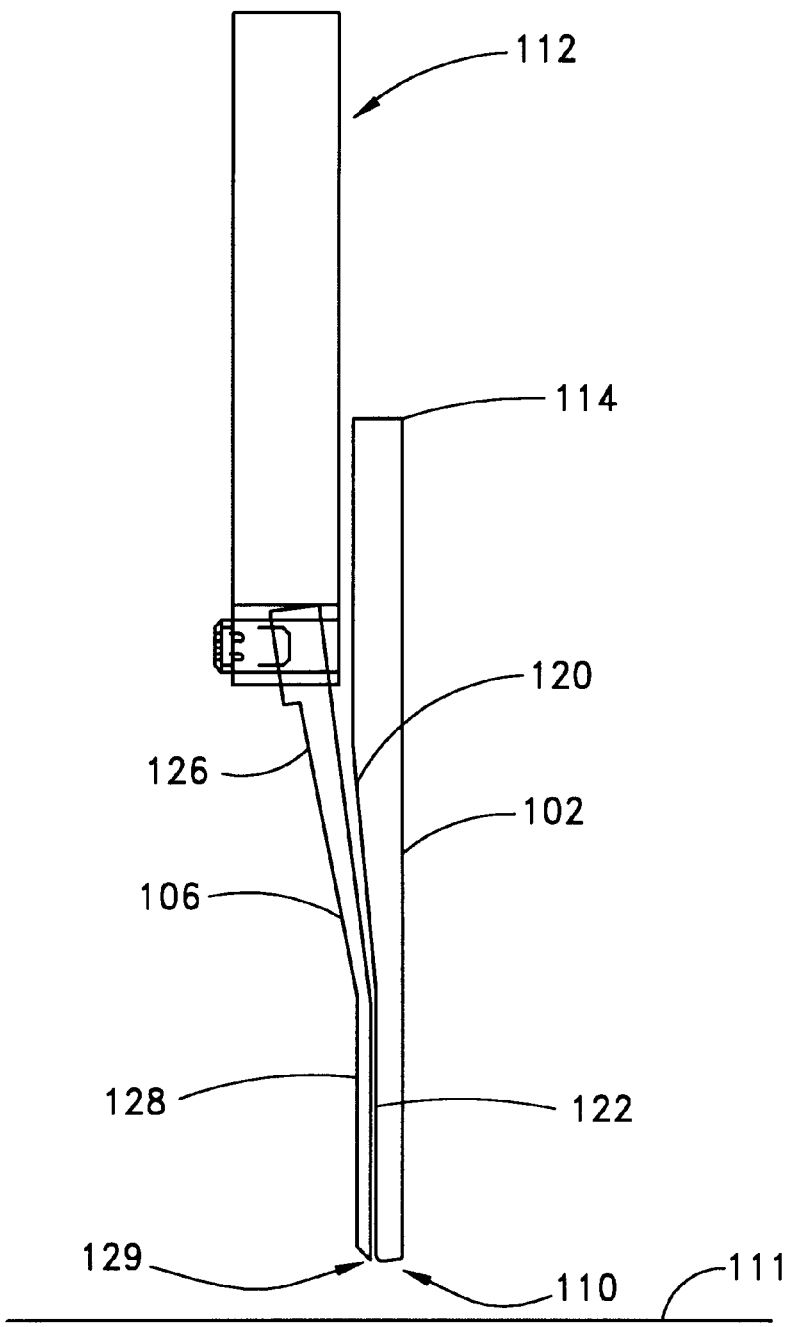
FIG. 8 is a schematic side view of the cutter holder and cutter of FIGS. 7A–7D positioned adjacent a bonding tool.

Below the inclined surface 120, the lower portion 116 of bonding tool 102 also preferably has a substantially flat surface 122 extending substantially parallel to the longitudinal axis of the bonding tool toward the bottom tip 110. This surface 122 is more preferably parallel to the surface 118. The length of the surface 122 from the intersection with surface 120 to the bottom tip 110 can vary according to the desired length or footprint for bonding. In the embodiment shown in FIG. 3A, for example, this length is about 0.065 inches. FIG. 8, described below, illustrates the surface 122 having a larger length. The plane corresponding to the surface 122 is preferably displaced from the plane corresponding to the surface 118 by a distance sufficient to accommodate positioning of the cutter 122, described below. For instance, in the embodiment shown in FIG. 3A, this displacement is about 0.03 inches.

Overall, the length of the lower portion 116, as measured from the bottom tip 110 to the intersection of the inclined surface 120 with the vertical surface 118 of upper portion 114, can vary depending on the desired bonding apparatus, and in particular, the size and length or footprint of the desired bonding location. For instance, in the embodiment shown in FIG. 3A, the length of the lower portion 116 is about 0.7 inches. It will be appreciated that all of the dimensions provided herein are merely examples of certain preferred embodiments, and thus, other dimensions may be used, as wire size and bond footprint may dictate.

The bonding tool 102 also preferably includes a wire guide 104. This wire guide 104 more preferably includes groove formed into the bonding tool and a hole inside the cross-section of the bonding tool. As shown in FIGS. 3A and 3C, the wire guide 104 extends partially through the upper portion 114 and preferably entirely through the lower portion 116 toward the bottom tip 110. The wire guide 104 is more preferably substantially vertical in grooved region 104a from upper portion 114 through a substantial section of lower portion 116 when the bonding tool has a vertical orientation. In one embodiment, where the bonding tool is about 2 inches long, the groove 104a preferably begins at a distance between about 0.5 and 0.8 inches from the bottom tip 110 of the bonding tool. In the embodiment shown in FIG. 3A, this distance is about 0.7 inches. The vertical groove 104a preferably extends from the upper portion 114 through a substantial section of lower portion 116, and in the embodiment shown, is about 0.6 inches long. The groove 104a is preferably about 0.02 inches deep with a rectangular shape.

The groove 104a intersects with a preferably round hole 104b and turns at an angle toward the bottom tip 110 of the bonding tool. This is illustrated in FIG. 3A as angle β as measured from the horizontal plane intersecting the junction between the regions 104a and 104b. The angle β is preferably between about 65 and 85 degrees. The diameter in region 104b is preferably smaller than the depth in region 104a, and in the embodiment shown, is about 0.014 inches.

FIGS. 4A–4B illustrate the bonding tool 102 turned 90 degrees counterclockwise when viewed from above along its longitudinal axis, relative to the view shown in FIG. 3A. FIG. 4A illustrates that in the lower portion 116, the bonding tool is further tapered such that the distance between opposite sides 117a, 117b of the tool decreases toward the bottom tip 110 of the tool. In the embodiment of FIG. 4A, this taper preferably begins at about 0.3 inches from the bottom tip 110. On side 117b of the tool 102, a step down 124 is preferably provided which further reduces the dimension of the tool near the bottom tip 110. For a two inch long bonding tool, this step down 124 is preferably about 0.08 to 0.15 inches above the bottom tip 110, and in the embodiment shown, the height of the step down, as measured from the bottom tip 110, is about 0.1 inches. The step down 124 preferably extends horizontally inward from side 117b by a distance of about 0.03 inches as shown in FIG. 4B.

Figure 5:
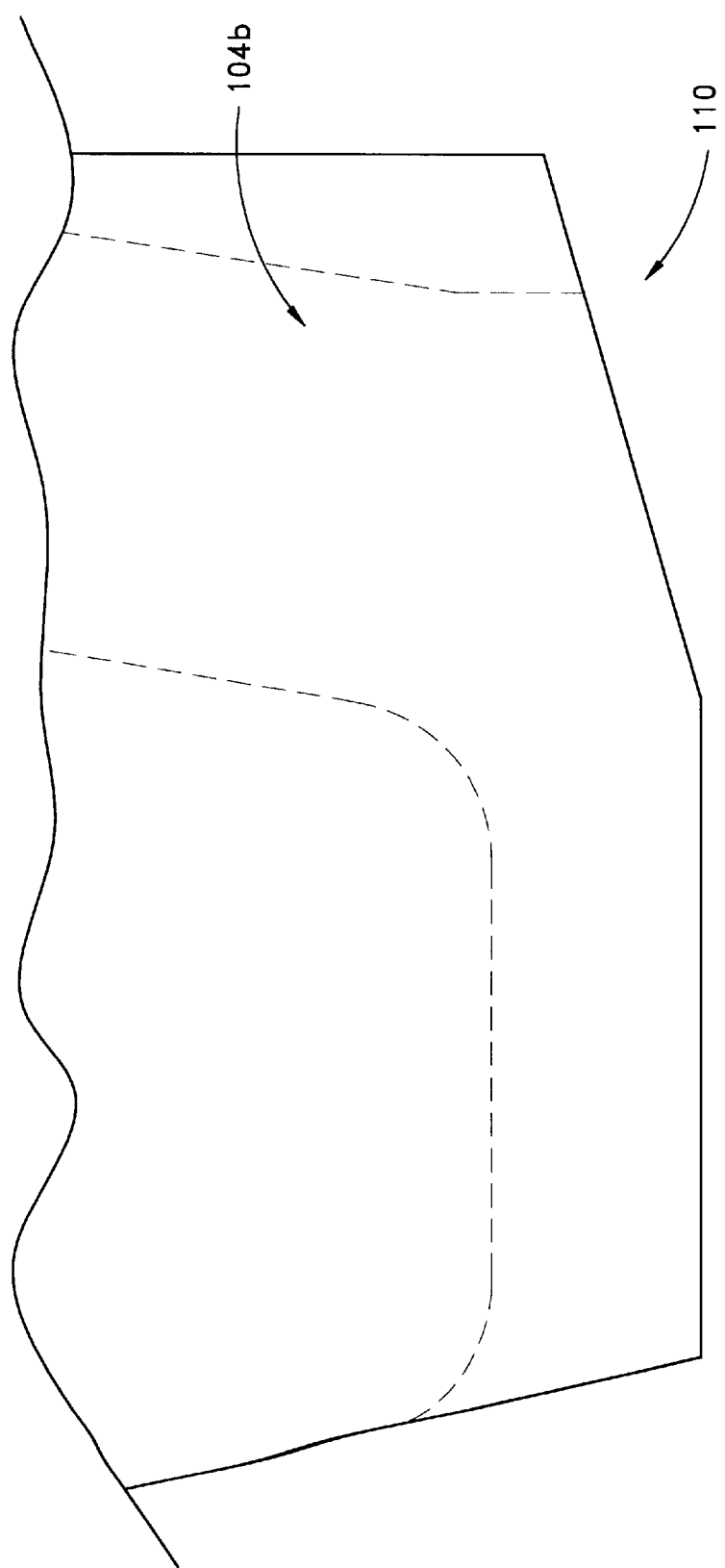
FIG. 5 is an enlarged side view of the tip of a bonding tool.

FIG. 5 illustrates an enlarged view of a bottom tip 110 of a bonding tool similar to that shown in FIG. 3A. The bottom tip 110 of the bonding tool of FIG. 5 preferably angles upward toward the wire guide side of the bonding tool. The wire guide hole 104b is preferably polished or lined with a low-friction material to allow the wire 108 (not shown) to pass more easily through the hole.

Figure 6:
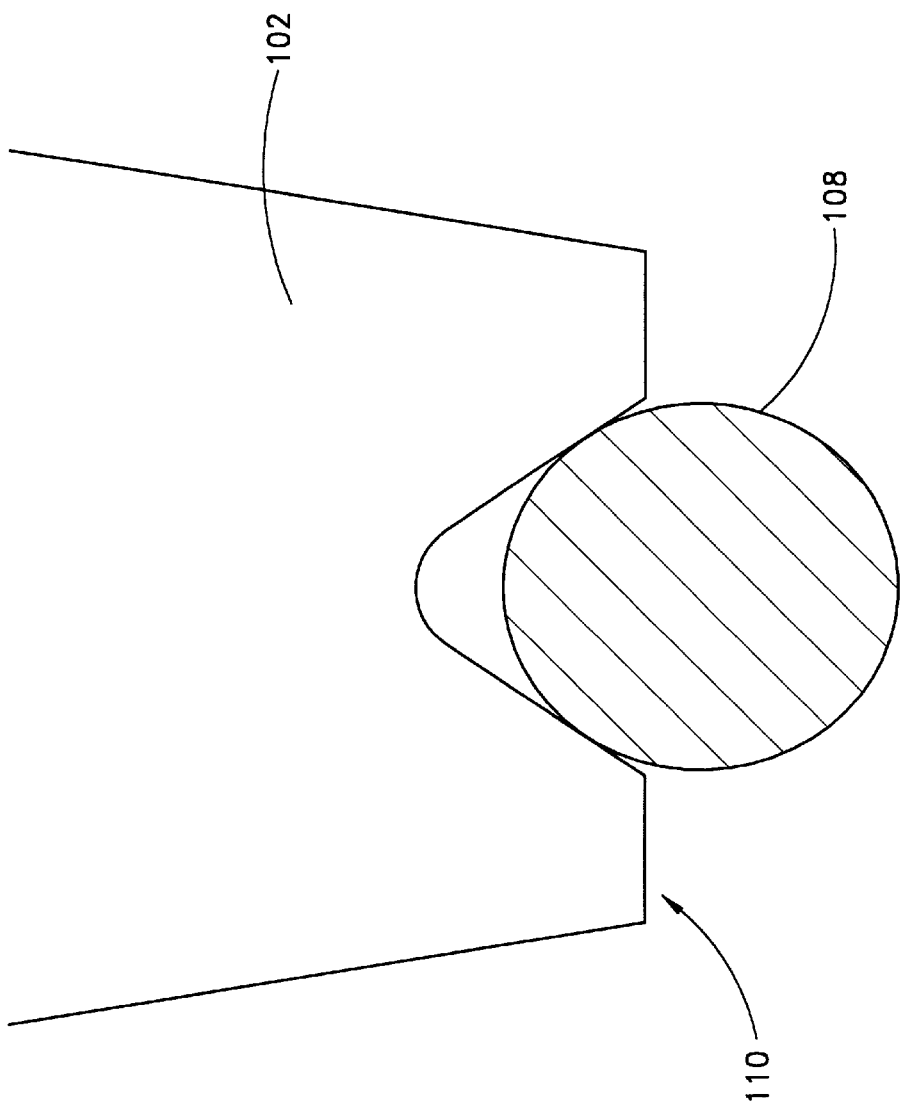
FIG. 6 is an enlarged partial cross-sectional view of the tip of a bonding tool.

FIG. 6 illustrates an enlarged view of the bottom tip 110 of a bonding tool similar to that shown in FIG. 4A, with a wire 108 extending thereunder. FIG. 6, which shows the bonding tool without a step down, illustrates that the step down 124 described above is optional depending on the need for greater fine pitch bonding.

In one embodiment, the bottom tip 110 preferably has a length l from the cutter side to the wire guide side of between about 0.05 and 0.075 inches, and more preferably, about 0.063 inches as shown in FIG. 3A. The width w of the bottom tip 110, as indicated in FIG. 4A, is preferably between about 0.008 and 0.04 inches, and in the embodiment shown, about 0.024 inches. Thus, in one preferred embodiment the approximate cross-sectional area of the bonding tool at the tip is about $1.512 \times 10^3$ in$^2$, as compared to about 0.01227 in$^2$ in the upper portion 114 when the upper portion has a diameter of about 0.125 inches. More generally, the cross-sectional area of the bottom tip is preferably less than about 50% of the cross-sectional area of the upper portion, more preferably less than about 20% in order to enable bonding with the tip 110 in spaces of very small dimension.

Figure 7B:
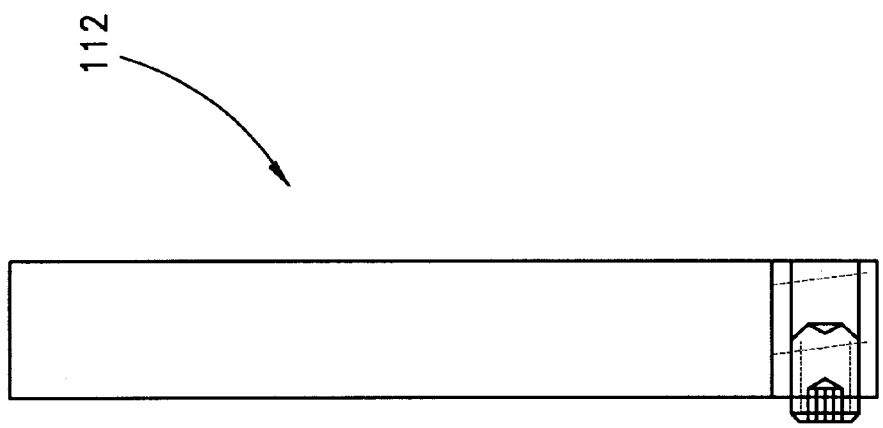
FIGS. 7A–7B are schematic side views of a cutter holder according to one embodiment of the present invention.
Figure 7A:
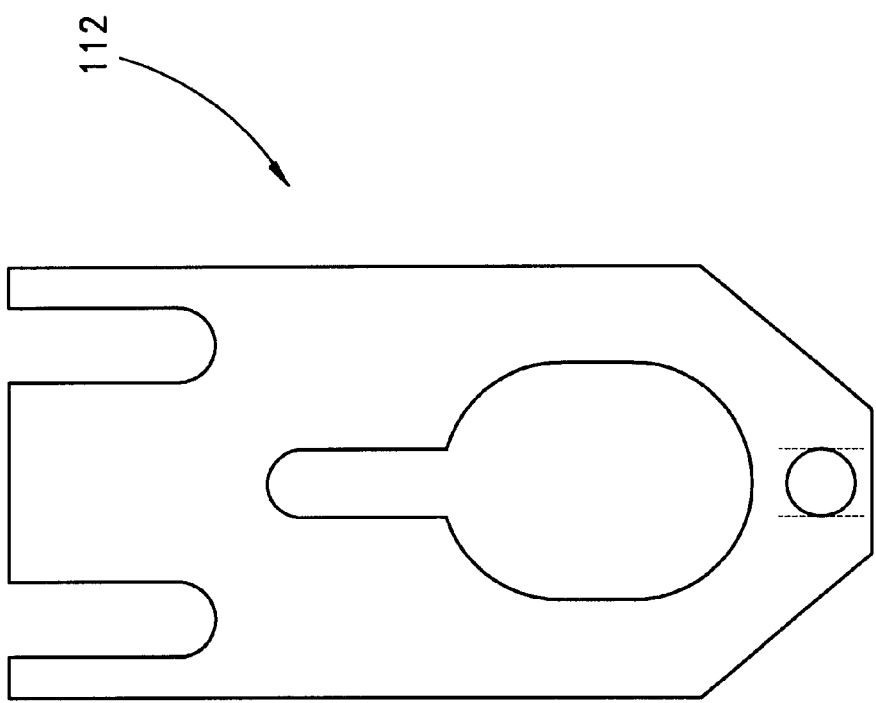

FIGS. 7A and 7B are side views of one embodiment of a cutter holder 112 as illustrated in FIG. 2. The cutter holder 112 supports a cutter 106, shown in side views in FIGS. 7C and 7D, which is mounted within the bond head 100. The cutter 106 generally includes two portions, specifically an upper or proximal portion 126 and a lower or distal portion 128, shown in FIG. 7D. The upper portion of the cutter 126 in one embodiment is preferably about 0.09 inches long. The cutter preferably tapers in cross-sectional area in the upper portion 126 to a smaller cross-sectional area in the lower portion 128 by decreasing the thickness of the cutter in the upper portion 126. For example, the cutter may have a thickness $t_1$ of about 0.125 inches in upper portion 126, and a thickness $t_2$ of about 0.03 inches in lower portion 126.

The lower portion 128 preferably joins the upper portion 126 at an angle γ. This angle is preferably between about 150 and 185 degrees, and in the embodiment shown, about 173 degrees. The length of the lower portion 128 preferably depends on the dimensions of the corresponding bonding tool. In one embodiment, the lower portion preferably has a length between about 0.6 inches. More particularly, the length of the lower portion 128 preferably corresponds to the length of the substantially flat surface 122 of the tool 102, as described below. The lower portion 128 preferably maintains a substantially constant cross-section having a thickness $t_2$ toward the cutting tip 129.

FIG. 7C illustrates the cutter 106 turned 90 degrees along its longitudinal axis from the view shown in FIG. 7D. The cutter 106 from this perspective has a constant width $x_1$, for example, of about 0.125 inches from the top of the cutter over a substantial length of its body. Near the bottom tip 129 of the cutter, the cutter 106 has a gradually decreasing width $x_2$, which for example, decreases to a width of between about 0.02 inches at the bottom tip 129. In this embodiment, the gradually decreasing width $x_2$ extends over a distance of about 0.3 inches.

FIG. 8 illustrates the cutter holder 112, the cutter 106 and a bonding tool 102 when assembled in one preferred arrangement. The cutter 106 preferably extends downward from the cutter holder 112 such that the upper portion 126 of the cutter is angled toward the bonding tool and the lower portion 128 is substantially vertical when the bonding tool is to be brought down perpendicular to a horizontal substrate 111. More preferably, the upper portion 126 of the cutter preferably extends along the inclined surface 120 of the bonding tool into the undercut area beneath the upper portion, and the lower portion 128 preferably extends along the vertical surface 122. As illustrated, the lower portion 128 including cutting tip 129 preferably falls substantially entirely within a projection of the cross-sectional area of the upper portion 114 of the bonding tool 102 onto a plane perpendicular to the longitudinal axis of the bonding tool. More preferably, when the bonding tool 102 is oriented generally vertically and perpendicular to the substrate 111, the lower portion 128 preferably falls substantially entirely within a vertical projection of the cross-sectional area of the upper portion 114 onto the substrate. Thus, when the bonding tool and cutter are brought down to the substrate, the two components together adjacent the substrate occupy a minimal area that is preferably no greater than the cross-sectional area of the upper portion of the bonding tool 102.

Thus, it will be generally appreciated that the embodiments described above enable deep-access, close proximity and fine pitch bonding of wires, especially large wires, by providing a bonding tool and associated apparatus that occupy a minimal amount of space adjacent the substrate to be bonded. More particularly, the bonding tool preferably tapers in its lower portion to provide an undercut area beneath the upper portion of the bonding tool such that a cutter extends into the undercut area, thereby minimizing the cross-sectional area of these components adjacent the substrate to be bonded.

Moreover, the wire guide is provided through the bonding tool to further minimize the size of the bonding apparatus at the bonding site. Placing the wire guide integrally with the bonding tool also enables the wire to be directed at an angle to the substrate closer to the longitudinal axis of the bonding tool, as compared to wire guides of the prior art. Because of the orientation of the wire through this wire guide, wire loops can be more easily made without the extra machine motion often used in prior art bonders to form back-bends in the wire. This thereby increases the machine cycling rate and speeds up the wire bonding process.

The embodiments illustrated and described above are provided merely as examples of certain preferred embodiments of the present invention. Various changes and modifications can be made from the embodiments presented herein by those skilled in the art without departure from the spirit and scope of the invention, as defined by the appended claims.

What is claimed is:

1. A wire bonding apparatus for bonding wire to a substrate, comprising:
    an ultrasonic bonding tool having an upper portion, a lower portion and a bottom tip, wherein the bonding tool in the lower portion adjacent the tip has a reduced cross-sectional area compared to the cross-sectional area of the bonding tool in the upper portion; and
    a cutter having an upper portion and a lower portion mounted adjacent the bonding tool extending along at least a portion of the bonding tool toward the tip, wherein the cutter in the lower portion extends at least partially into a projection of the cross-sectional area of the upper portion onto a plane perpendicular to the longitudinal axis of the bonding tool,
    wherein the lower portion of the cutter lies entirely within the projection of the cross-sectional area of the upper portion of the bonding tool.

2. The wire bonding apparatus of claim 1, wherein the bonding tool is tapered such that the bonding tool reduces in cross-sectional area in the lower portion toward the bottom tip.

3. The wire bonding apparatus of claim 2, wherein the taper is formed at least in part by a substantially flat, inclined surface extending from the upper portion toward the tip, the inclined surface forming an angle with the longitudinal axis of the bonding tool.

4. The wire bonding apparatus of claim 3, wherein the angle of the inclined surface relative to the longitudinal axis of the bonding tool is between about 5 and 20 degrees.

5. The wire bonding apparatus of claim 3, wherein the lower portion of the bonding tool further comprises a substantially flat surface extending from the inclined surface to the bottom tip.

6. The wire bonding apparatus of claim 5, wherein the substantially flat surface extending from the inclined surface to the bottom tip is substantially parallel to the longitudinal axis of the bonding tool.

7. A wire bonding apparatus for bonding wire to a substrate, comprising:
    an ultrasonic bonding tool having an upper portion, a lower portion and a bottom tip, wherein the bonding tool in the lower portion adjacent the tip has a reduced cross-sectional area compared to the cross-sectional area of the bonding tool in the upper portion; and
    a cutter mounted adjacent the bonding tool extending along at least a portion of the bonding tool toward the tip, wherein the cutter extends at least partially into a projection of the cross-sectional area of the upper portion onto a plane perpendicular to the longitudinal axis of the bonding tool,
    wherein the bonding tool is tapered such that the bonding tool reduces in cross-sectional area in the lower portion toward the bottom tip, wherein the taper is formed at least in part by a substantially flat, inclined surface extending from the upper portion toward the tip, the inclined surface forming an angle with the longitudinal axis of the bonding tool, wherein the lower portion of the bonding tool further comprises a substantially flat surface extending from the inclined surface to the bottom tip, wherein the substantially flat surface extending from the inclined surface to the bottom tip is substantially parallel to the longitudinal axis of the bonding tool, and wherein the cutter has an upper portion and a lower portion, the upper portion extending substantially along the inclined surface of the bonding tool and the lower portion extending substantially along the substantially flat surface extending from the inclined surface to the bottom tip of the bonding tool.

8. The wire bonding apparatus of claim 7, wherein the lower portion of the cutter lies substantially entirely within the projection of the cross-sectional area of the upper portion of the bonding tool.

9. The wire bonding apparatus of claim 1, further comprising a wire guide integrally formed into the bonding tool to direct a wire toward the bottom tip.

10. A wire bonding apparatus for bonding wire to a substrate, comprising:
    an ultrasonic bonding tool having an upper portion, a lower portion and a bottom tip, wherein the bonding tool in the lower portion adjacent the tip has a reduced cross-sectional area compared to the cross-sectional area of the bonding tool in the upper portion;
    a cutter mounted adjacent the bonding tool extending along at least a portion of the bonding tool toward the tip, wherein the cutter extends at least partially into a projection of the cross-sectional area of the upper portion onto a plane perpendicular to the longitudinal axis of the bonding tool; and a wire guide integrally formed into the bonding tool to direct a wire toward the bottom tip, wherein the wire guide lies substantially entirely within the projection of the cross-sectional area of the upper portion of the bonding tool.

11. The wire bonding apparatus of claim 10, wherein the wire guide includes a first portion that is substantially parallel to the longitudinal axis of the bonding tool and a second portion that is a hole angled relative to the first portion toward the bottom tip.

12. A wire bonding apparatus, comprising:

a bonding tool extending longitudinally between a proximal portion and a distal portion, the distal portion of the bonding tool including a bonding tip for ultrasonically bonding wire to a substrate;

a cutter mounted adjacent the bonding tool and extending substantially longitudinally adjacent at least a portion of the bonding tool, the cutter having a proximal portion and a distal portion, the distal portion of the cutter including a cutting tip, wherein at least the distal portion of the cutter extends adjacent the distal portion of the bonding tool; and an undercut area between the proximal portion of the bonding tool and the tip of the bonding tool configured to accommodate at least a portion of the cutter, such that at least part of the distal portion of the cutter extends into the undercut area;

wherein the combination of the distal portion of the cutter and the distal tip of the bonding tool occupies a cross sectional area that is substantially no greater than the cross sectional area of the proximal portion of the bonding tool.

13. The wire bonding apparatus of claim 12, wherein the undercut area is defined by a taper in the distal portion of the bonding tool that reduces the cross-sectional area of the bonding tool toward the distal tip.

14. The wire bonding apparatus of claim 12, wherein the bonding tool has a cross-sectional area in the distal portion near the bonding tip that is less than about 50% of the cross-sectional area in the proximal portion.

15. The wire bonding apparatus of claim 12, wherein the bonding tool is generally cylindrical.

16. The wire bonding apparatus of claim 12, wherein the bonding tool is oriented substantially vertically, and the distal portion of the cutter extending into the undercut area lies entirely underneath the proximal portion of the bonding tool.

17. The wire bonding apparatus of claim 12, further comprising a groove and a hole within the bonding tool for directing wire toward the bonding tip.

18. A method of bonding wire to a substrate, comprising:

providing a bonding tool having an upper portion and a lower portion defining a longitudinal axis therebetween, wherein the lower portion has a smaller cross-sectional area than the upper portion, wherein the lower portion includes a bonding tip;

guiding a wire to a position between the lower portion of the bonding tool and the substrate;

ultrasonically bonding the wire to the substrate using the bonding tool;

providing a cutter having a cutting tip adjacent the substrate, the cutter extending generally longitudinally along the length of the bonding tool, wherein the cutting tip is positioned within a projection of the cross-sectional area of the upper portion of the bonding tool onto a plane perpendicular to the longitudinal axis of the bonding tool; and cutting the wire after bonding the wire with the cutting tip.

19. The method of claim 18, wherein the wire is guided through a groove in the lower portion of the bonding tool.

20. The method of claim 18, wherein the lower portion of the bonding tool includes an inclined surface on the side of the bonding tool adjacent the cutter.

21. The method of claim 20, wherein the lower portion of the bonding tool further includes a substantially flat surface generally parallel to the longitudinal axis of the bonding tool on the side of the bonding tool adjacent the cutter, the substantially flat surface being located between the inclined surface and the bonding tip.

22. The method of claim 20, wherein the cutter includes an upper portion which extends generally along the inclined surface and a lower portion that extends generally parallel to the substantially flat surface.

\* \* \* \* \*